(12) United States Patent
Ahmad

(10) Patent No.: US 7,061,815 B2
(45) Date of Patent: Jun. 13, 2006

(54) SEMICONDUCTOR MEMORY DEVICE PROVIDING REDUNDANCY

(75) Inventor: Nasim Ahmad, Mandawall (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 189 days.

(21) Appl. No.: 10/911,233

(22) Filed: Aug. 3, 2004

(65) Prior Publication Data

US 2005/0057961 A1    Mar. 17, 2005

(30) Foreign Application Priority Data

Aug. 5, 2003    (IN) .................................... 966/03

(51) Int. Cl.
*G11C 7/00*    (2006.01)

(52) U.S. Cl. .................................. 365/200; 365/189.05

(58) Field of Classification Search ................ 365/200, 365/489.05, 225.7
See application file for complete search history.

(56) References Cited

U.S. PATENT DOCUMENTS 5,659,551 A  *  8/1997  Huott et al. ................. 714/725
5,742,556 A     4/1998  Tavrow et al.
6,314,030 B1   11/2001  Keeth

* cited by examiner

*Primary Examiner*—Vu A. Le
(74) *Attorney, Agent, or Firm*—Hogan & Hartson L.L.P.

(57) ABSTRACT

An improved semiconductor memory device providing row/column redundancy. The device includes a plurality of data latches arranged in a row-column matrix connected to a set of bitlines/global bitlines interfacing to read/write circuitry, at least two redundant row/column connected to a redundant bitline/global bitline, a first device for providing a first faulty row/column address in said matrix, a second device for generating other faulty row/column addresses by incrementing or decrementing predetermined numbers from the address provided by the first means, a comparison circuitry receiving as its inputs the accessed row/column address and the faulty row/column addresses, and a control block connected to the said comparison circuitry that receives a control signal such that it enables/disables the redundant and/or other memory cell row/column depending upon signals received from said comparison circuitry and control signal for normal operation of the memory device.

9 Claims, 4 Drawing Sheets

SEMICONDUCTOR MEMORY DEVICE PROVIDING REDUNDANCY

FIELD OF THE INVENTION

The invention relates to an improved semiconductor memory device providing redundancy.

BACKGROUND OF THE INVENTION

Static Random Access Memories (SRAMs) contain millions of extremely thin vias, long metal rails, and a large number of transistors in multiple layers of metal. Owing to the large number of elements, the probability of failure of a device is not negligible. One of the most common reasons for SRAM failures is a single defect in the memory core region, e.g. contact/via malformation or a malformed transistor. Incorporating redundancy schemes can compensate this type of failure in SRAMs. The redundancy schemes ensure normal functioning of the memory device by compensating for most single defects, thereby improving yield and reducing the effective cost of the device.

Current row and column redundancy schemes cover single defects efficiently only for unshared components. However, in practice, many contacts and vias that are potential defects are shared by adjacent cells to reduce device area. Whether the fault can be corrected in such resource-shared devices using the conventional redundancy schemes depends upon the location of the defect, and hence, the percentage fault coverage due to the single defect is not independent of memory architecture and therefore, is generally unsatisfactory. There is a need for improving the efficacy of redundancy schemes.

There are two basic types of the redundancy schemes, row redundancy and column redundancy. Row redundancy schemes are not popular owing to the fact that the fault coverage provided by them is relatively less due to the high sharing of resources. On the other hand, row redundancy schemes provide the advantages of reduced settling time, simpler circuitry, and higher area efficiency. Further, the testability of redundant rows in the row redundancy scheme is simpler and faster due the fact that the memory cells are designed for efficient row-by-row access.

U.S. Pat. No. 6,314,030 discloses a segmented row repair scheme. In this patent, the memory cell array is divided into segments of rows with each segment containing a redundant row. The repair scheme disclosed suffers from a number of constraints owing to the fact that each segment contains one redundant row that requires an address storage block, thereby increasing the size and cost of the device. The arrangement also makes it difficult to test the redundant rows. The scheme also does not provide any solution for the failure of shared elements.

FIG. 1 illustrates a column redundancy scheme for semiconductor memory architecture 100 according to U.S. Pat. No. 5,742,556. In this scheme the write multiplexers 102 are located prior to the write bit line drivers 104. The fuse data corresponding to the defective column is decoded in the columns by the combination of AND gates 112 and OR gates 114 for each regular column. The AND 112 and OR 114 gates form a decision unit that determines whether an actual bitline is to be used or an adjacent bitline is to be used. Since the inputs to AND gates 112 are connected in a sequential count arrangement, only one AND gate 112 is activated for any combination of programmed fuses. The active AND gate 112 corresponds to the defective regular column. The active AND gate output activates the associated OR gate 114 and the signal then ripples sequentially through the OR gates 114 to the "right". Hence, from the defective column to the right, the SRAM columns are all shifted to the right and, finally at the far right, the redundant column which includes its own write driver 104 is also used.

In this type of redundancy scheme, the built in self-test (BIST) within the memory devices introduces a significant delay during soft repair runs because of the rippling of signals causing higher settling times. The arrangement also requires complex circuitry to enable the rippling of data and requires large area for its implementation. Further, such a column redundancy scheme does not provide immunity to the memory device against failure of a shared component. Furthermore, the probability of the failure of two rows/columns in the event of single component malformation is a linear function of the number shared components in the peripheral circuitry. A single row or single column redundancy scheme can correct only single column or row failures.

Referring to FIG. 2, most of the shared components are located on top and bottom boundaries. These shared component are either shared on the boundary of row R[n−1] and row R[n] or row R[n] and row R[n+1]. In such rectangular memory cell arrangements, the fault coverage in row redundancy schemes are as low as 33%, whereas reduced number of shared component between columns results in percentage fault coverage in columns as much as 75%. On the other hand, in the case of non-rectangular cell (vertical) arrangements, despite of the complicated circuit and higher area penalties column redundancy provides lower coverage than row redundancy. However, it is not possible to achieve 100% percent fault coverage due to a single defect in a memory array or row decoder.

SUMMARY OF THE INVENTION

The object of this invention is to obviate the above and other drawbacks in the prior art and provide a semiconductor memory device with redundancy schemes providing improved single defect fault coverage in memory arrays and row decoders in case of shared component failure. Another object of the invention is to provide at least two redundant rows/column for storing data of at least two rows/columns, which share a defective resource. It is another object of the invention to reduce the size and cost of the testability of the device. Yet another object of the invention is to reduce the number of address storage elements required. A further object of the invention is to provide a faulty row/column address generator for generating faulty addresses by using stored faulty address. Another object of the invention is to provide a device without any impact on the timing performance due to the addition of redundancy.

To achieve the above and other objects, the invention provides an improved semiconductor memory device providing redundancy including:

- a plurality of data latches arranged in a row-column matrix connected to a set of bitlines/global bitlines interfacing to read/write circuitry;
- at least two redundant rows/columns connected to the read write circuitry of the memory device;
- a first means for providing a first faulty row/column address in said row-column matrix;
- a second means for generating other faulty row/column addresses by incrementing or decrementing predetermined numbers from the address provided by the first means;

a comparison circuitry receiving its inputs from the accessed row/column address and the faulty row/column addresses; and a control block connected to the said comparison circuitry that receives a control signal to enable/disable the redundant rows/columns and/or other memory cell rows depending upon signals received from said comparison circuitry and a control signal for normal operation of the memory device.

In one embodiment, the first method for providing faulty row/column addresses is a nonvolatile storage means including fuses and nonvolatile data latches. The second method for generating other faulty addresses is a logic circuit. The logic circuit includes cascaded logic gates for generating row/column addresses. The logic gates are NAND gates, NOR gates, or a combination of these gates.

The number of redundant rows/columns depends upon the extent of sharing of a resource by different rows/columns in the device. The predetermined number depends upon the maximum sharing of a resource by different rows/column in the device.

The instant invention further provides an improved method providing row/column redundancy in semiconductor memories including:

arranging a plurality of data latches in row-column matrix such that each column of the array provides at least one bitline/global bitline for connecting to read/write circuitry;

providing at least two redundant rows/columns of data latches connected to the read/write circuitry of the memory device;

supplying a first faulty row/column address;

generating other faulty addresses by incrementing or decrementing a predetermined number from the first faulty address;

comparing the access row/column address and the faulty row/column addresses and;

enabling/disabling redundant and/or other memory cell rows/columns depending upon the comparison results and a control signal for normal operation of the memory architecture.

BRIEF DESCRIPTION OF THE DRAWINGS

The invention will now be described with reference to the accompanying drawings.

DETAILED DESCRIPTION

Figure 1:
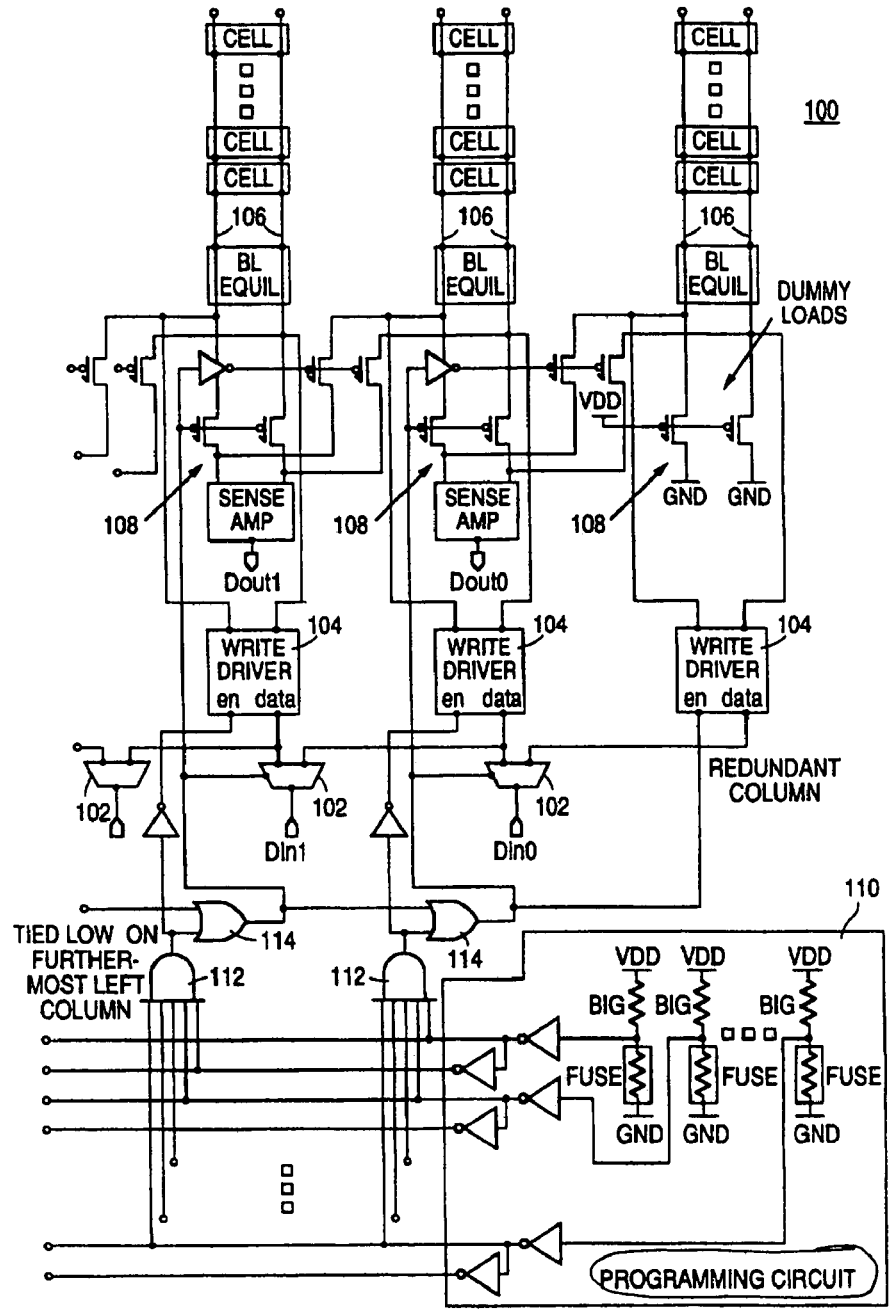
FIG. 1 illustrates the column redundancy scheme for a semiconductor memory architecture according to U.S. Pat. No. 5,742,556.

FIG. 1 has already been described under the heading 'Background of the Invention'.

Figure 2:
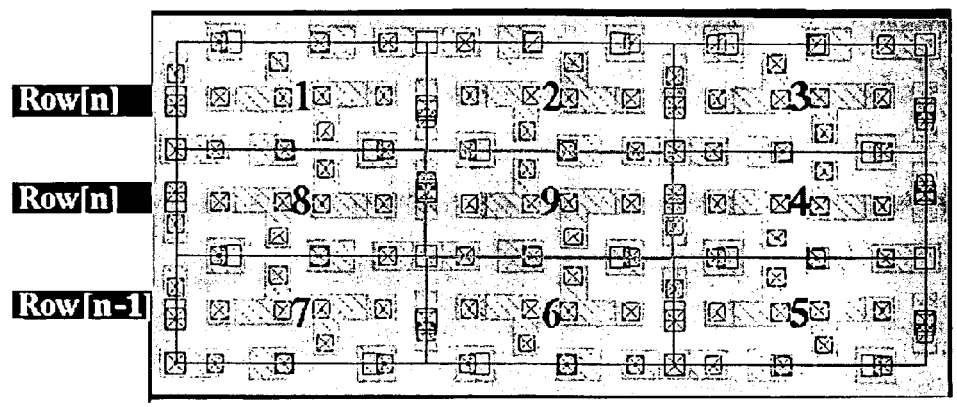
FIG. 2 illustrates a 3×3 array of memory cells.

FIG. 2 illustrates a 3×3 array of memory cells. Assuming cell 9 has a malfunctioning component and depending upon location of the malfunctioning component, the following failures are possible:

1. For an unshared component, only cell 9 would fail.
2. For a component that is being shared by cell 9 and cell 2, both cell 2 and cell 9 will not function normally. Similarly, if the sharing is between cell 9 and cell 4 or cell 9 and cell 6 or cell 9 and cell 8, then, corresponding cells will not function properly.
3. A failed component that is at the top left corner of the cell 9 will result in abnormal functioning of cell 9, cell 1, cell 2, and cell 8. Similarly, any other components at the corners will result in abnormal functioning of corresponding shared cells depending upon the corner at which the failed component is located.

In general, a defect in one cell of row R[n] can result in failure of either row R[n−1] or in row R[n+1] along with R[n], for a memory architecture which shares its single resource between a maximum of two cells. The number of failing rows depend upon the order of resource sharing in a given memory architecture, i.e., in case of a shared component failure, all those row may not function normally which share the failing component.

A person skilled in the art would appreciate that a similar example can be discussed for malfunctioning resources shared by columns.

Figure 3:
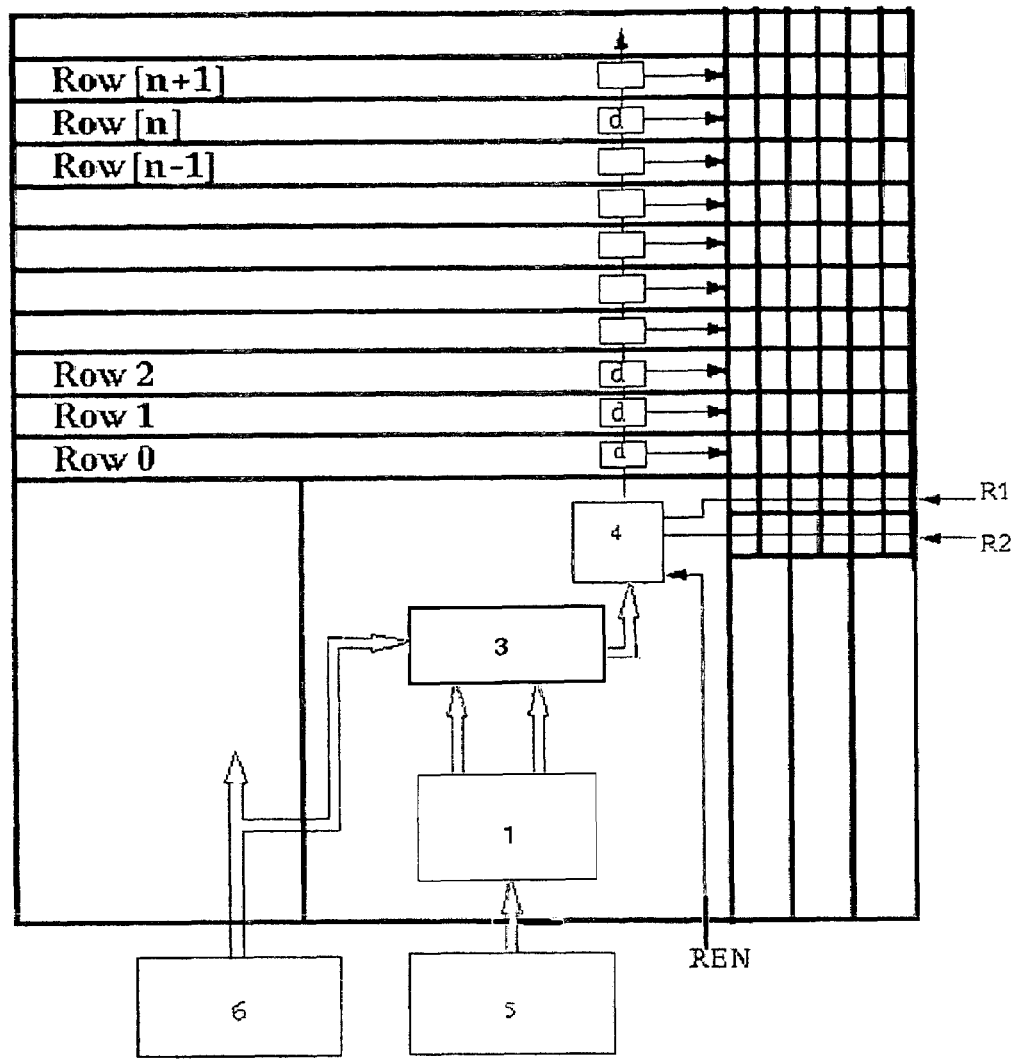
FIG. 3 shows a block diagram of the memory architecture in accordance with the present invention.

FIG. 3 shows a block diagram of the memory architecture in accordance with the present invention. The present invention provides a Built In Self Test (BIST) in the memory device. In the test process, a standard bit map is written in the memory that is then read row-by-row from top to bottom or otherwise. As discussed earlier, a fault in a row R[n] may result in a fault in an adjacent row, i.e., either R[n+1] or R[n−1]. Assuming that the test process starts from bottom to top, that is from the zeroth row onwards, then the address of a row (say row R[n]) which is recognized as a faulty row BIST is then stored in the storage block 5. In this particular case, since the testing has started from the zeroth row and has encountered a faulty row, only at R[n] it indicates that all the rows up to R[n−1] including R[n−1] are functioning properly, and the only row that can be affected due to the fault in row R[n] is the row R[n+1].

To cover this fault, the present invention provides an address generator 1 which generates one or more addresses of the rows by incrementing or decrementing a predetermined number from the address of the faulty rows, which are affected due to sharing of the faulty resource. The address generator 1 receives its input from logic block 5 and has its output connected to the input of comparing block 3. Comparing block 3 receives inputs from the address generator 1 as well as from the input address and provides comparison results to control block 4. The control block 4 enables/disables the redundant row R1, R2 and/or other memory cell rows depending upon the comparison results and the Redundancy Enable signal, REN. This redundancy scheme provides one hundred percent fault coverage for all types of (SRAM, ROM, DRAM, etc.) memories.

Since the invention provides at least two redundant rows for storing data of at least two consecutive faulty rows which share a defective resource and also uses a faulty row address generator for generating faulty addresses by using stored faulty address, it does not require a separate storage element for each redundant row and therefore, provides a cost and area effective solution.

Further, the invention allows immediate switching of the redundant row, thereby addressing problems associated with the prior art devices with regard to settling time by providing an unimpaired timing performance despite the addition of redundancy.

Figure 4:
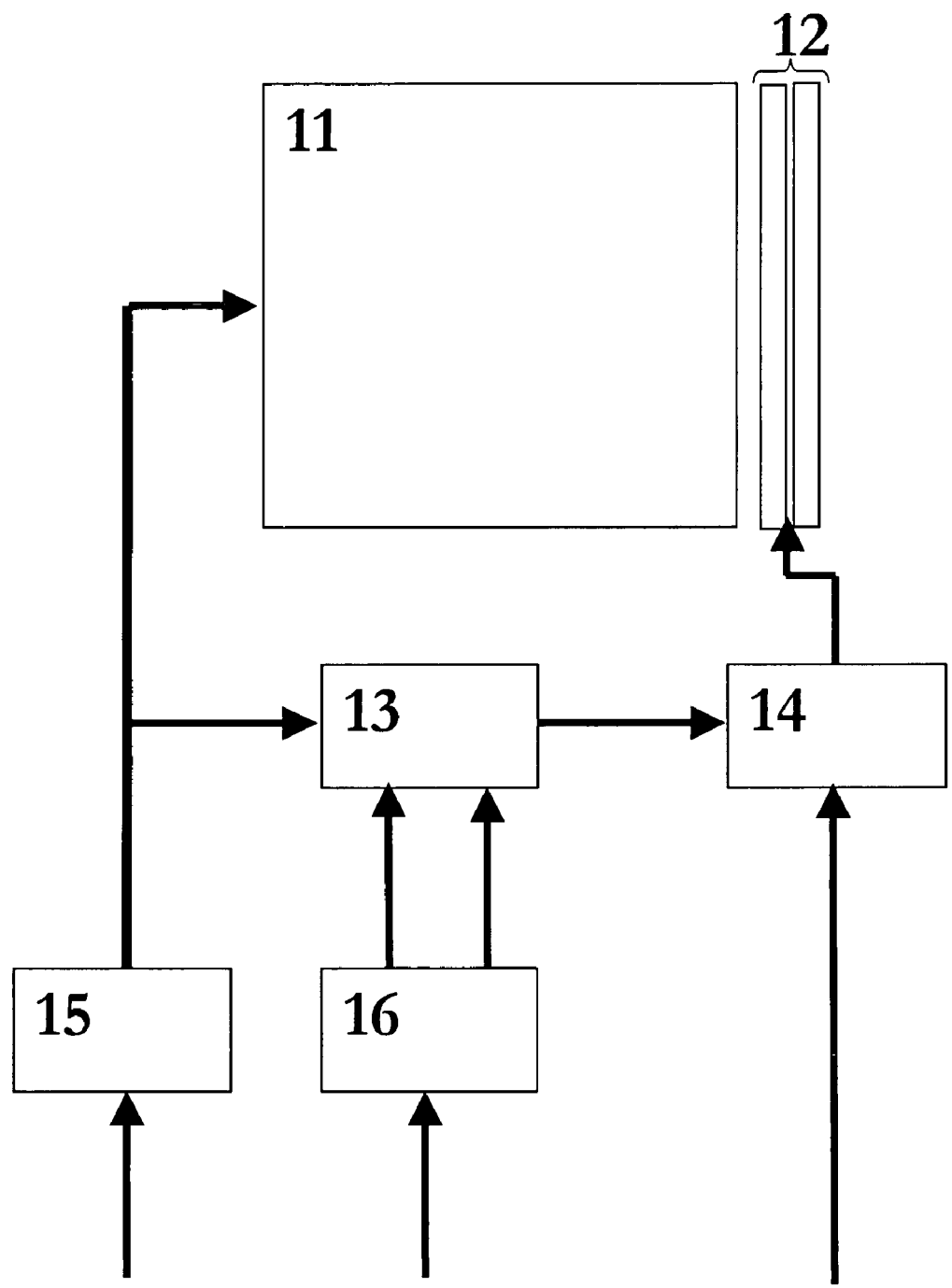
FIG. 4 shows another embodiment in accordance with the present invention describing column redundancy.

FIG. 4 shows another embodiment in accordance with the present invention describing column redundancy. The invention provides a plurality of data latches 11 arranged in a row-column matrix connected to a set of bitlines/global bitlines interfacing to read/write circuitry. This embodiment of the invention further provides at least two redundant columns 12 connected to read write circuitry of the memory device and a first means 16 for providing faulty column addresses in said row-column matrix. The invention provides a comparison circuitry 13 receiving its inputs from the accessed column address 15 and the faulty column addresses 16. A control block 14 is provided that is connected to the comparison circuitry 13 that receives a control signal to enable/disable the redundant columns and/or other memory cell rows depending upon signals received from said comparison circuitry 13 and a control signal for normal operation of the memory device.

The invention described herein is illustrative only and no way limiting. A person skilled in the art would appreciate that it is easy to design a memory device using the same concept but with a larger number of redundant rows depending upon the memory architecture. Further, a similar concept is equally applicable to the column redundancy scheme where 100 percent single defects can be covered for the resource-shared memory architecture.

We claim:

1. A semiconductor memory device providing row/column redundancy, comprising:
   a plurality of data latches arranged in a row-column matrix connected to a set of bitlines/global bitlines interfacing to read/write circuitry;
   at least two redundant rows/columns connected to a bitline/global bitline and to at least two redundant wordlines;
   first means for providing a first faulty row/column address in said row-column matrix;
   second means for generating other faulty row/column addresses by incrementing or decrementing predetermined numbers from one of the addresses provided by the first means;
   a comparison circuitry receiving its inputs from the accessed row/column address and the faulty row/column addresses and;
   a control block connected to the said comparison circuitry that receives a control signal to enable/disable one of the redundant rows/columns and/or another memory cell row/column corresponding to the other faulty row/column addresses depending upon signals received from said comparison circuitry and a control signal for normal operation of the memory device.

2. A semiconductor memory device as claimed in claim 1, wherein the first means for providing a first faulty row/column address is a nonvolatile storage device including fuses and nonvolatile data latches.

3. A semiconductor memory device as claimed in claim 1, wherein said second means for generating other faulty row/column addresses is a logic circuit.

4. A semiconductor memory device as claimed in claim 3, wherein said logic circuit includes cascaded logic gates for generating row/column addresses.

5. A semiconductor memory device as claimed in claim 4, wherein said logic gates are NAND gates, NOR gates, or a combination of NAND and NOR gates.

6. A semiconductor memory device as claimed in claim 1, wherein the number of the at least two redundant rows/columns depends upon an extent of sharing of a resource by different rows/columns in the memory device.

7. A semiconductor memory device as claimed in claim 1, wherein said predetermined numbers depend upon a maximum sharing of a resource by different rows/columns in the memory device.

8. A method for providing row/column redundancy in semiconductor memories, comprising:
   arranging a plurality of data latches in a row-column matrix such that each column of the matrix provides at least one bitline/global bitline for connecting to read/write circuitry;
   providing at least two redundant rows/columns of data latches connected to the at least one bitline/global bitline;
   supplying a first faulty row/column address;
   generating other faulty addresses by incrementing or decrementing a predetermined number from the first faulty row/column address;
   comparing an access row/column address and the faulty row/column addresses; and
   controlling enabling and disabling of one or more of the at least two redundant rows/columns or another memory cell row/column depending upon results of the comparing and upon a control signal to provide normal.

9. A memory architecture with an enhanced redundancy scheme, comprising:
   a plurality of data latches arranged in a row-column matrix, wherein each column of the row-column matrix comprises a bitline;
   two redundant columns of the data latches connected to column bitlines;
   means for supplying a first faulty column address;
   a generating device generating additional faulty addresses by incrementing or decrementing a predetermined number from the first faulty column address;
   a comparison mechanism comparing an access column address and the first faulty column address; and
   a controller configured for enabling or disabling at least one of the two redundant columns based on the output of the comparison mechanism and on a control signal provided as input to the controller.

* * * * *